United States Patent [19]
Ruppi

[11] Patent Number: 5,635,247
[45] Date of Patent: Jun. 3, 1997

[54] ALUMINA COATED CEMENTED CARBIDE BODY

[75] Inventor: Sakari Ruppi, Fagersta, Sweden

[73] Assignee: Seco Tools AB, Fagertsa, Sweden

[21] Appl. No.: 390,506

[22] Filed: Feb. 17, 1995

[51] Int. Cl.⁶ .................................................. B05D 3/04
[52] U.S. Cl. .................. 427/348; 427/376.2; 427/419.3
[58] Field of Search ............................ 427/348, 376.2, 427/419.3

[56] References Cited

U.S. PATENT DOCUMENTS

| | | | |
|---|---|---|---|
| Re. 31,520 | 2/1984 | Lindstrom et al. | 7/138 |
| Re. 32,110 | 4/1986 | Hale | 428/336 |
| 3,736,107 | 5/1973 | Hale | 29/182.7 |
| 5,071,696 | 12/1991 | Chatfield et al. | 428/220 |
| 5,137,774 | 8/1992 | Ruppi | 428/216 |
| 5,162,147 | 11/1992 | Ruppi | 428/216 |

FOREIGN PATENT DOCUMENTS 603144   6/1994   European Pat. Off. ........ C23C 16/40

Primary Examiner—Benjamin Utech
Attorney, Agent, or Firm—Burns, Doane, Swecker & Mathis, L.L.P.

[57] ABSTRACT

An improved multilayer alumina coated cemented carbide insert is made by depositing on the substrate a κ-alumina layer, wet blasting the surface of that insert and then heat-treating the resulting insert at 900° C.–1100° C. for 0.3–10 hours to convert the κ-alumina to α-alumina. One or more further alumina layers can then be applied.

9 Claims, 5 Drawing Sheets

ALUMINA COATED CEMENTED CARBIDE BODY

BACKGROUND OF THE INVENTION

Aluminum oxide coatings deposited on cemented carbides generally with either an intermediate coating of one or more of TiC, Ti(C,N), TiN compounds or a gamma-phase enriched substrate are well-known. Products made according to, for example, Hale (U.S. Reissue Pat. No. 32,110) and Lindstrom et al. (U.S. Reissue Pat. No. 31,520) describe such products which have enjoyed considerable commercial success in their use as inserts for metal cutting.

In my earlier U.S. Pat. Nos. 5,137,774 and 5,162,147, the disclosures of both of which are herein incorporated by reference, there are described particular coatings of κ phase alumina and/or α and κ phase alumina including multi-layered coatings. While such products offer significant improvements over single layer α and/or κ alumina coated cemented carbide inserts, there is a further need for optimization of such products.

It is also known that a κ-alumina coating can be heat-treated to convert the κ-form to the α-form. Such a heat treatment is disclosed in U.S. Pat. No. 5,071,696, herein incorporated by reference, and produces a fine-grained structure of the κ-alumina. The heat treatment, however, can lead to shrinkage which can lead to cracks in the coating and possible loss by flaking of some or all of the coating layer.

There is thus a need for further improvements in the production of alumina-coated cemented carbide bodies.

In EP Publication 0 603 144 A1 there is disclosed an alumina-coated cemented carbide body in which the alumina coating surface is smoothened by wet blasting.

OBJECTS AND SUMMARY OF THE INVENTION

Figure 1A:
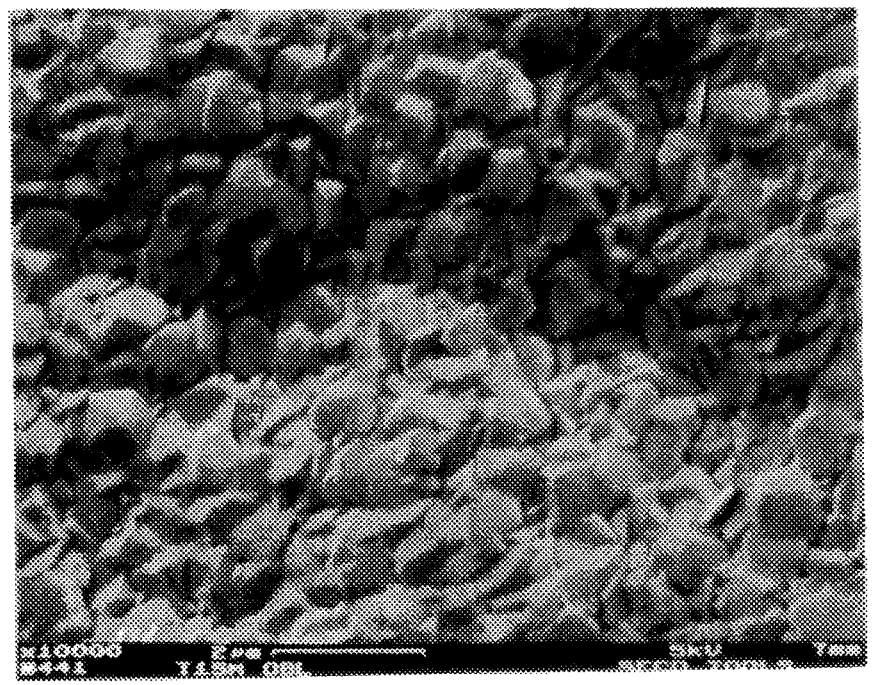
FIG. 1A is a Scanning Electron Micrograph (SEM) (10000×) of the surface of a cemented carbide body as coated with a κ-alumina layer.

It is an object of this invention to avoid or alleviate the problems of the prior art.

It is further an object of this invention to provide a multilayered alumina coated cemented carbide insert having significant operating advantages.

In one aspect of the invention, there is provided a method for producing a multilayered alumina coated cemented carbide insert comprising depositing a κ-alumina coating on a cemented carbide substrate, wet blasting the surface of the alumina coating and heat treating the wet-blasted κ-alumina surface at a temperature of 900° C.–1100° C. for 0.3–10 hours to convert the wet-blasted κ-alumina to α-alumina.

In another aspect of the invention, there is provided the body made by that process.

DETAILED DESCRIPTION OF THE PREFERRED EMBODIMENTS OF THE INVENTION

According to the preferred embodiment of the present invention, a cemented carbide substrate has a thin κ-alumina coating formed thereon in accordance with known techniques such as those described in my earlier patents mentioned above. The coated body is then wet blasted and then subjected to a heat treatment to convert the κ-alumina to α-alumina. The heat treatment can be performed at a temperature of from 900° C.–1100° C. for 0.3–10 hours in a protective gas atmosphere as known to the skilled artisan.

Thereafter, at least one other alumina layer (either κ- or α-alumina) can be applied onto the resulting alumina layer. If further κ-alumina layers are deposited, they also may be wet blasted and, if desired, heat treated to convert the κ-form to α-alumina.

The substrate of the present invention is a hard metal or cemented carbide as known in the art which comprises a major part of the metal carbide, such as tungsten carbide, with minor additions, if desired of, for example, TiC, NbC, HfC, VC or the like, with an iron group metal binder, preferably cobalt. Often, and prior to the deposition of the alumina coating, the cemented carbide is first coated with a thin intermediate layer of a wear resistant carbide, nitride, carbonitride, carboxide, carboxynitride and/or boride of one or more of the elements Ti, Zr, Hf, V, Nb, Ta, Cr, Mo, W, Si and/or B having a thickness of from about 1–5 μm, preferably about 3 μm. TiC, TiN, and/or Ti(C,N) are preferred.

The alumina layer thereafter applied can be up to about 1.5 μm thick, preferably from about 0.5–1 μm thick. The alumina layer(s) ultimately applied thereafter are also of the same thickness with the total thickness being up to about 15 μm.

It has been found that when κ-alumina is to be deposited that the underlying alumina layer (whether α or κ) should contain a thin modification layer to insure the nucleation of κ-aluminum as the next coating. A modification layer is not necessary (and is generally deleterious to adhesion) between the thin intermediate layer (e.g., TiC, TiN, and/or Ti(C,N)) and the first κ-alumina layer. The modification layer is a thin (0.05–0.5 μm, preferably about 0.05–0.1 μm) surface oxidized layer, for example, of $(Al_xTi_y)(O_wC_z)$ deposited via CVD where y and x are from 2–4 and z and w are from 0.6–0.8.

The modification layer may also contain nitrogen, e.g., $(Al_xTi_y)(O_wC_zN_u)$ where x and y are from 2–4 and w and z and u are from 0.6–0.8. In addition, the layer may have a homogenous chemistry or may preferably have a nitrogen gradient that varies throughout its thickness with the maximum nitrogen content in the middle of the modification layer.

Wet blasting is performed as known to the skilled artisan, using, for example, alumina particles of relatively small particle size, for a time sufficient to smooth the surface of the alumina coating applied under pressure. Specific parameters can be determined by the skilled artisan by examination of the surface after particular treatment.

Heat treatment to convert the κ-form to α-form is also well-known (see U.S. Pat. No. 5,071,696) and can be performed at a temperature of 900° C.–1100° C. for 0.3–10 hours, preferably 1–4 hours, preferably in a protective gas atmosphere.

Figure 3:
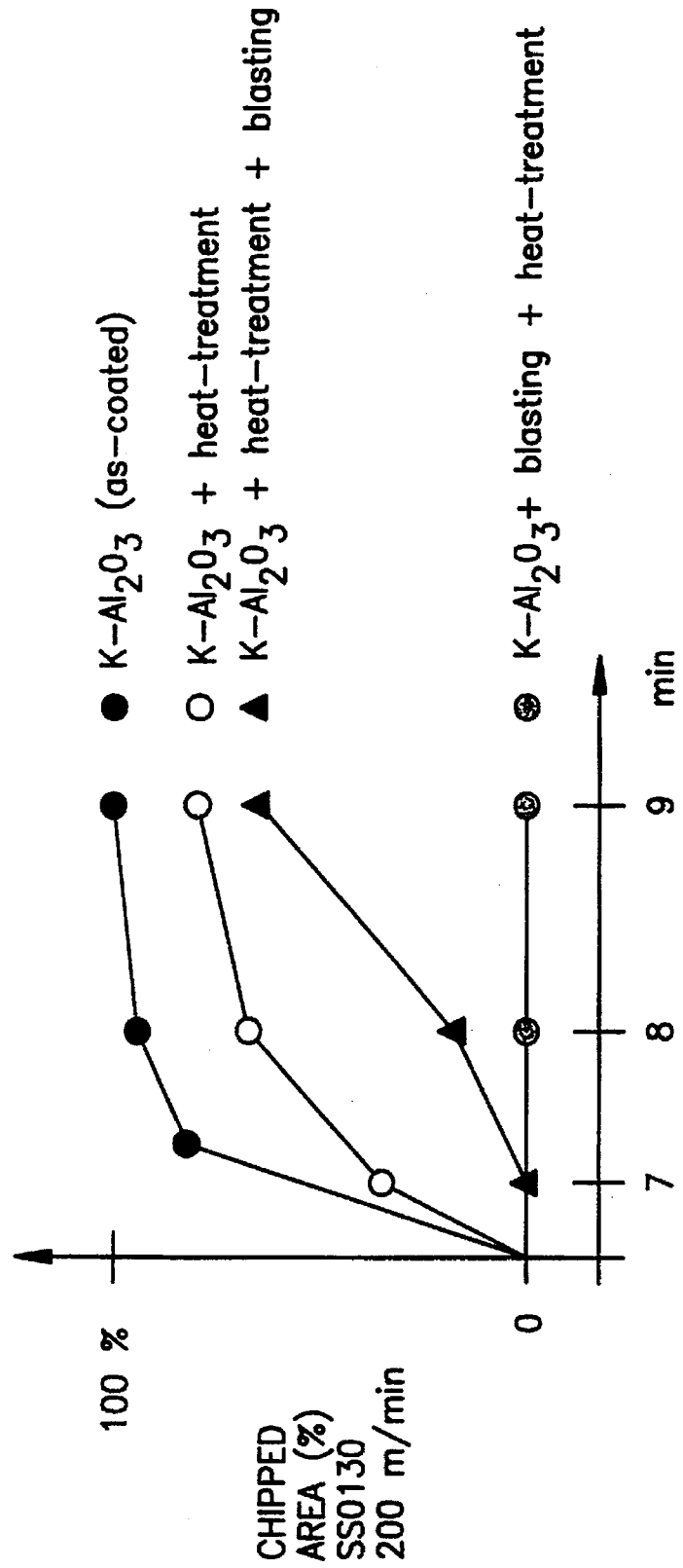
FIG. 3 is a graph of chipping resistance for metal cutting inserts of bodies made with various combinations of coating, heat treatment and wet blasting.

It has surprisingly been found that the chipping resistance of a multilayer cemented carbide body made in accordance with the present invention is considerably better than that of a κ-alumina coated cemented carbide body as well as that body after a heat treatment to convert the κ-form to α-form and that body surface blasted after heat treating (see FIG. 3). The cutting performance is also improved.

The edge toughness of coated bodies made according to the present invention is substantially better than that of cemented carbide bodies made with a directly deposited α-alumina coating.

The coated inserts of the present invention display a finer grain size (approaching nanocrystalline) than directly deposited α-alumina coating. Also, they have a preferred growth orientation according to x-ray diffraction analysis of 300 (thick oxide) and 100 (thin oxide), a high transverse rupture strength and a fine crack network in the coating.

Coating of the alumina layers may continue until a desired number of coating layers are formed.

Atop the outermost layer of alumina there may be applied an optional TiN layer for decorative purposes. This TiN layer can have a thickness of from 0.5–2 μm, preferably about 1 μm.

Figure 1B:
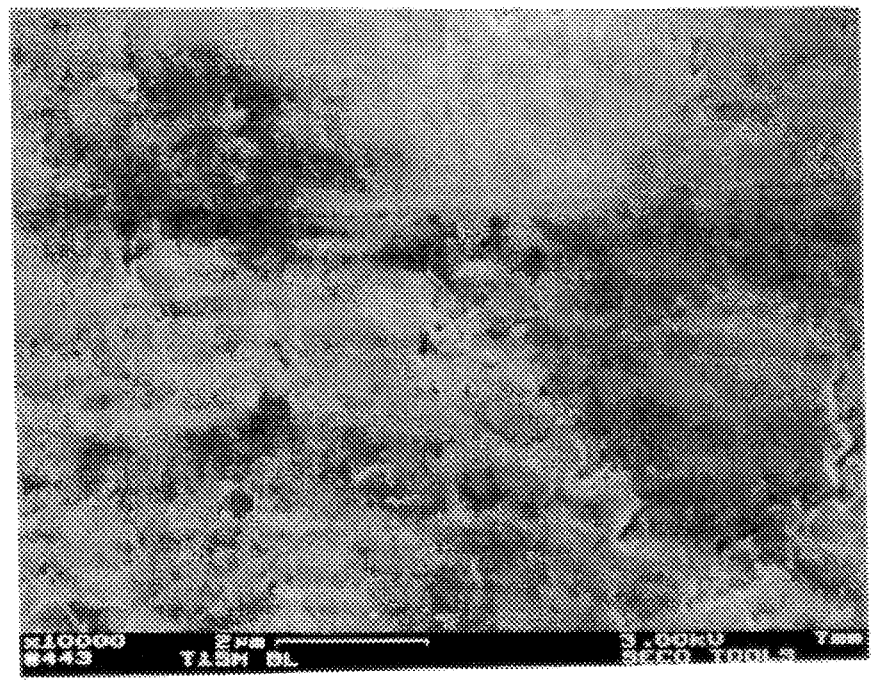
FIG. 1B is an SEM (10000×) of the body of FIG. 1A after it has been wet blasted.

The morphology of coated cemented carbide inserts can be seen in FIGS. 1A–1F. FIG. 1A shows a cemented carbide body with a κ-alumina coating in the as-coated condition. FIG. 1B shows that coated body after it has been blasted with 150 mesh $Al_2O_3$ particles in water applied at 2–6 bar.

Figure 1C:
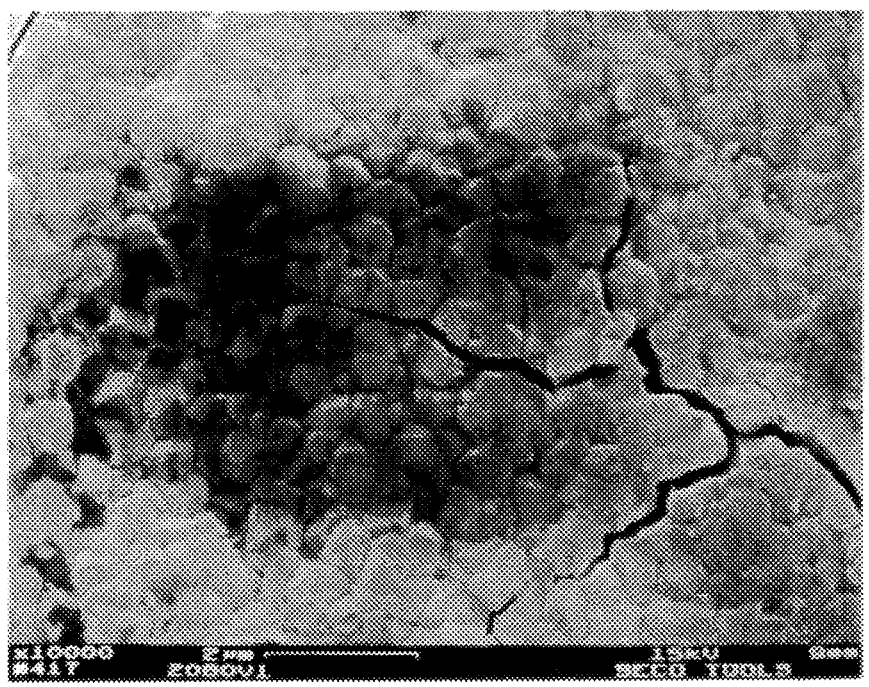
FIG. 1C is an SEM (10000×) of the body of FIG. 1A after it has been heat treated at 1050° C. for 100 minutes.
Figure 1D:
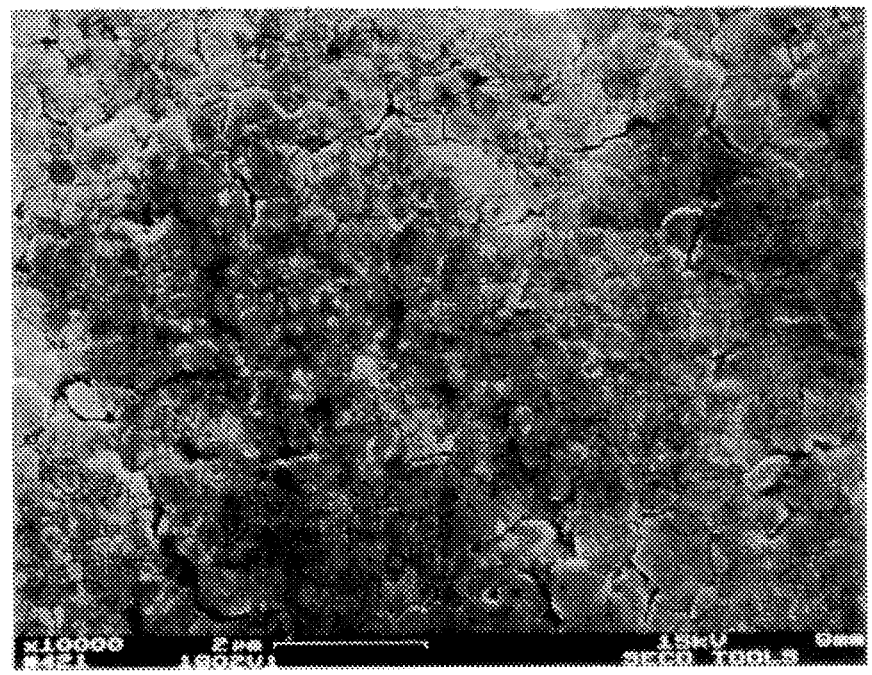
FIG. 1D is an SEM (10000×) of the body of FIG. 1A after it has been wet blasted and then heat treated at 1050° C. for 100 minutes.

FIG. 1C is an SEM of a cemented carbide body coated with a κ-alumina layer (about 1 μm thick) and then heat treated to convert the coating to the α-form (1050° C. for 100 minutes) with no intermediate surface blasting. FIG. 1D is an SEM of a similar body which was blasted like the body of FIG. 1B and then heat treated at 1050° C. for 100 minutes. Note the absence in FIG. 1D of the large cracks as in FIG. 1C and the much finer grain size in FIG. 1D.

Figure 1E:
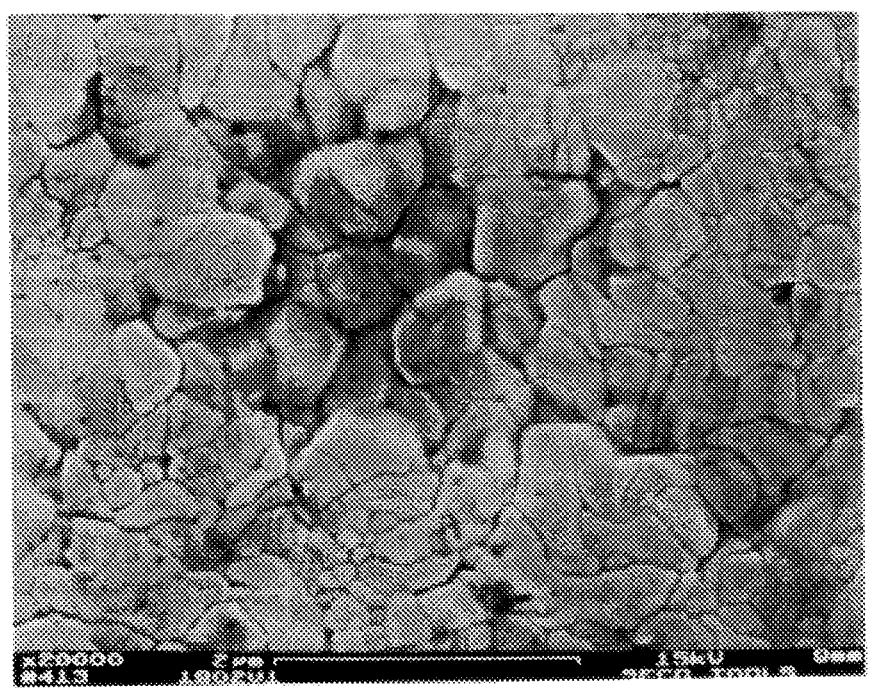
FIG. 1E is an SEM of the body of FIG. 1D at 20000×.
Figure 1F:
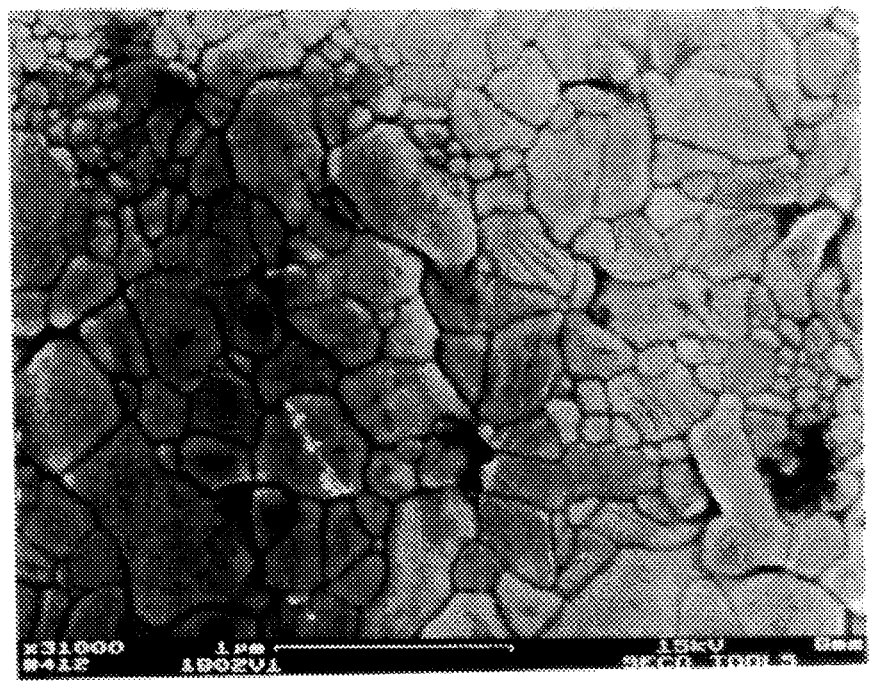
FIG. 1F is an SEM of the body of FIG. 1D at 31000×.

FIGS. 1E and 1F show the surface morphology of the body of FIG. 1D at higher magnifications (20000× and 31000×, respectively). Again, the fine-grained and fine-cracked surface is evident.

Figure 2:
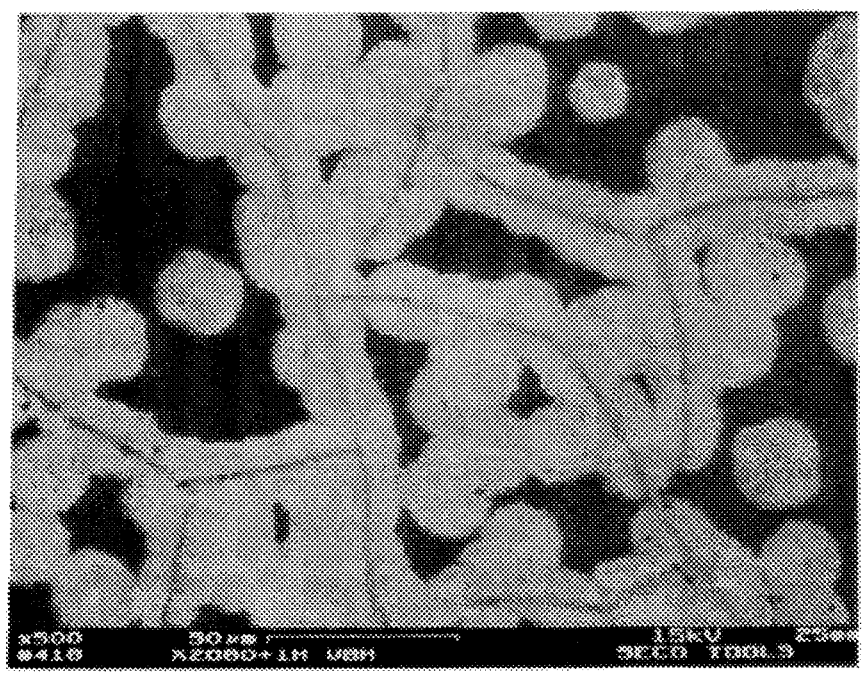
FIG. 2 is a photomicrograph (500×) of a κ-alumina coated cemented carbide insert head treated at 1050° C. for 100 minutes without wet blasting before the heat treating.

FIG. 2 shows at 500× the surface of a cemented carbide body with a κ-alumina formed without an intermediate surface blasting. The κ→α transformation is uneven and starts from the thermal cracks. The κ→α transformation is not complete. In a similar body which was wet blasted as described above prior to heat treatment, the κ→α transformation was complete after the same time (100 minutes), was more uniform and resulted in a finer grain size.

The presence of the fine cracks in the coating of the present invention may be the result of stress relaxation or the absorption of larger cracks. Regardless, and I do not wish to be bound to any particular theory, the present invention results in a higher transverse rupture strength as compared to the body with the original κ-alumina coating.

The invention is additionally illustrated in connection with the following Examples which are to be considered as illustrative of the present invention. It should be understood, however, that the invention is not limited to the specific details of the Examples.

EXAMPLE

Commercial cemented carbide inserts of a composition 85.5% WC, 6% TaC, 2.5% TiC and 5.5% Co are coated under the following coating conditions:

Step 1

Ti Coating

| Gas Mixture | Balance | Duration | Temperature | Pressure |
| --- | --- | --- | --- | --- |
| $TiCl_4$:3.5% $CH_4$:5.5% | $H_2$ | 200 minutes | 1020° C. | 50 mbar |

Step 2

Alumina Coating

| Gas Mixture | Balance | Duration | Temperature | Pressure |
| --- | --- | --- | --- | --- |
| $AlCl_3$:2.1% $CO_2$:3.7% $H_2S$:0.02% | $H_2$ | 90 minutes | 1000° C. | 50 mbar | resulting in a κ-alumina coating of about 1 μm thickness.

Step 3

Blasting

The κ-alumina coated inserts of Step 2 are surface blasted with a water suspension of 150 mesh $Al_2O_3$ particles.

Step 4

Heat Treatment

The blasted inserts of Step 3 are heat treated at 1050° C. for 100 minutes under an atmosphere of argon.

These inserts are compared in a cutting test done on SS 0130 steel with a cutting speed of 200 m/min with similar inserts made with as-coated κ-alumina coating (Steps 1 and 2), inserts made with a heat-treated κ-alumina coating (Steps 1, 2 and 4) and inserts made with surface blasting after heat treatment (Steps 1, 2, 4 and then 3).

After 1, 3 and 6 minutes, the inserts are examined for the percent of chipped area on the surface of the coating. The results are graphically presented in FIG. 3. It can be seen that there are no chipped areas on the inserts of the present invention while those comparative inserts show increasingly greater amounts of chipped areas. These latter inserts are thus increasingly less useful as metal cutting inserts.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method for producing an alumina coated cemented carbide insert comprising depositing a κ-alumina coating on a cemented carbide substrate, wet blasting the surface of the κ-alumina coating and heat treating the wet-blasted κ-alumina surface at a temperature of 900°–1100° C. for 0.3–10 hours to convert the wet-blasted κ-alumina to α-alumina.

2. The method of claim 1 comprising depositing a second alumina coating on the α-alumina coating.

3. The method of claim 2 wherein the second alumina coating comprises κ-alumina.

4. The method of claim 3 wherein the second alumina coating is wet-blasted.

5. The method of claim 4 wherein the second alumina coating is thereafter heat treated to convert the κ-alumina to α-alumina.

6. The method of claim 2, wherein the second alumina coating comprises α-alumina.

7. The method of claim 1 wherein five to seven α-alumina layers are deposited on the heat treated α-alumina coating.

8. The method of claim 1 wherein the heat treating is performed for 1–4 hours.

9. The method of claim 1 wherein the wet blasting comprises applying a water suspension of $Al_2O_3$ particles at a pressure of about 2–6 bar to the κ-alumina coated surface.

* * * * *